United States Patent
Tallman et al.

(10) Patent No.: US 6,473,701 B1
(45) Date of Patent: Oct. 29, 2002

(54) ALTERNATE TRIGGERING IN DIGITAL OSCILLOSCOPES

(75) Inventors: James L. Tallman, Beaverton, OR (US); Kenneth R. Rockwell, San Diego, CA (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/444,110

(22) Filed: Nov. 22, 1999

(51) Int. Cl.[7] .................. G01R 13/20; G01R 13/02
(52) U.S. Cl. .................. 702/67; 702/66; 324/121 R
(58) Field of Search .................. 345/134, 147, 345/440.1; 324/121 R; 702/66, 67

(56) References Cited

U.S. PATENT DOCUMENTS

| | | | | |
|---|---|---|---|---|
| 4,482,861 A | * | 11/1984 | Jalovec et al. | 324/77 B |
| 4,558,422 A | * | 12/1985 | DenBeste et al. | 364/480 |
| 4,818,932 A | * | 4/1989 | Odenheimer | 324/121 R |
| 5,180,971 A | * | 1/1993 | Montijo | 324/121 R |
| 5,978,742 A | * | 11/1999 | Pickerd | 702/66 |
| 5,986,637 A | * | 11/1999 | Etheridge et al. | 345/134 |
| 5,995,117 A | * | 11/1999 | Dobyns et al. | 345/441 |

* cited by examiner

*Primary Examiner*—Marc S. Hoff
*Assistant Examiner*—Paul Kim
(74) *Attorney, Agent, or Firm*—David N. Caracappa; Thomas F. Lenihan

(57) ABSTRACT

A digital storage oscilloscope includes a source of two or more input signals and a display device. An alternate triggering mechanism includes a selector for selecting one of the input signals. A trigger circuit is responsive to the selected input signal, and generates a trigger signal when a trigger condition is satisfied. A raster signal generator includes a plurality of waveform memories each associated with a respective input signal and responsive to the trigger signal for storing data representing the selected input signal in the waveform memory associated with the selected input signal. The raster signal generator generates a raster image signal representing the selected input signal.

11 Claims, 3 Drawing Sheets

ALTERNATE TRIGGERING IN DIGITAL OSCILLOSCOPES

FIELD OF THE INVENTION

The present invention relates to triggering mechanisms and associated display modes in a digital storage oscilloscope

BACKGROUND OF THE INVENTION

Prior analog oscilloscopes included a triggering mode known as alternate triggering. In this mode of operation, traces of respective input signals were alternately displayed on the face of a display device, each triggered when it is displayed. The persistence of the phosphors on the screen of the display tube retained the image of each signal long enough for the signals to appear to be displayed stably and simultaneously.

FIG. 1 is a block diagram of a portion of a prior art analog oscilloscope having this triggering mode. In FIG. 1, input terminals are illustrated for two input signals, also called channel signals, CH1 and CH2. The input terminals CH1 and CH2 may, for example, be oscilloscope probes, which are connected to circuit nodes producing signals which the user wishes to observe. The channel 1 input terminal CH1 is coupled to an input terminal of a first input amplifier 12 and the channel 2 input terminal CH2 is coupled to an input terminal of a second input amplifier 14. An output terminal of the first input amplifier 12 is coupled to respective first data input terminals of a first analog multiplexer 20 and a second analog multiplexer 30. An output terminal of the second input amplifier 14 is coupled to respective second data input terminals of the first analog multiplexer 20 and the second analog multiplexer 30. An output terminal of the first analog multiplexer 20 is coupled to an input terminal of a vertical drive amplifier 40. Differential output terminals of the vertical drive amplifier 40 are coupled to respective vertical deflection plates 52 of a display tube 50.

An output terminal of the second analog multiplexer 30 is coupled to a first input terminal of a trigger circuit 60. In FIG. 1 the trigger circuit 60 is illustrated as a comparator, however one skilled in the art will understand that other triggering circuits were available in analog oscilloscopes as illustrated in FIG. 1. A source of a threshold signal, Th, is coupled to a second input terminal of the trigger circuit 60. An output terminal of the trigger circuit 60 is coupled to an input terminal of a sweep signal generator 70. Differential output terminals of the sweep signal generator are coupled to respective horizontal deflection plates 54 of the display tube 50. A status output terminal of the sweep signal generator 70 is coupled to an input terminal of a switch control circuit 80. Respective control output terminals of the switch control circuit 80 are coupled to control input terminals of the first analog multiplexer 20 and the second analog multiplexer 30

In operation, the first and second analog multiplexers 20 and 30 are simultaneously conditioned to couple to their output terminals a selected channel input signal, that is, either the channel 1 input signal CH1 or the channel 2 input signal CH2, under the control of the switch control circuit 80. For the following description, it will be assumed that the input signal initially selected is the channel 1 input signal CH1. Thus, the first analog multiplexer 20 couples the channel 1 input signal CH1 to the vertical drive amplifier 40 and the second analog multiplexer 30 couples the channel 1 input signal CH1 to the trigger circuit 60.

The trigger circuit 60 compares the channel 1 input signal, CH1, to the threshold amplitude Th. When the amplitude of the channel 1 input signal passes through the threshold amplitude Th, the trigger circuit 60 generates a signal at its output terminal which conditions the sweep signal generator 70 to produce a ramp signal. This ramp signal is applied to the horizontal deflection plates 54. The ramp signal at the horizontal deflection plates 54 produces a single sweep of the electron beam from the left edge to the right edge of the display screen, taking a user controlled period of time.

Simultaneously, the channel 1 input signal CH1 is amplified by the vertical drive amplifier 40 and applied to the vertical deflection plates 52. The signal at the vertical deflection plates 52 causes the vertical position of the electron beam sweep to vary as a function of the channel 1 signal amplitude. The combination of the vertical deflection plates 52 and the horizontal deflection plates 54 produce one visible trace on the face of the display tube 50 of the waveform representing the amplitude of the channel signal 1 over the time period specified by the sweep signal generator 70 starting at the time the trigger circuit detected the trigger condition.

When the horizontal sweep is completed, the control signal from the sweep signal generator 70 signals the switch control circuit 80 to condition the first and second analog multiplexers 20 and 30 to select the other channel input signal. That is, the first and second analog multiplexers 20 and 30 now both couple the channel 2 input signal, CH2, to their output terminals. The trigger circuit 60 triggers on the amplitude of the channel 2 input signal CH2 initiating a sweep via the sweep signal generator 70, and the vertical deflection plates 52 change the vertical position of the sweep according to the amplitude of this channel signal. The display device 50, thus, displays one trace of the channel 2 input signal CH2. When the sweep is complete, the switch control circuit 80 conditions the first and second analog multiplexers 20 and 30 to couple the channel 1 input signal CH1 to the vertical drive amplifier 40 and trigger circuit 60 once more, and the process begins again. Traces of the channel 1 signal and the channel 2 signal, each triggered by its own amplitude, are alternated on the face of the display tube 50 in this mode of operation, appearing stably and simultaneously due to phosphor persistence.

Digital oscilloscopes operate very differently from analog oscilloscopes. FIG. 2 is a block diagram of a known digital storage oscilloscope. In FIG. 2, elements which are the same as those illustrated in FIG. 1 are designated by the same reference numbers and are not described in detail below.

In FIG. 2, the output terminal of the channel 1 input amplifier 12 is coupled to an input terminal of a first A/D converter 122 and to a first input terminal of a trigger circuit 180, and more specifically to a first input terminal of a signal selector 182 in the trigger circuit 180. The output terminal of the channel 2 input amplifier 14 is coupled to an input terminal of a second A/D converter 124 and a second input terminal of the trigger circuit 180, and more specifically to a second input terminal of the signal selector 182. An output terminal of the first A/D converter 122 is coupled to an input terminal of a first acquisition memory 132 and an output terminal of the second A/D converter 124 is coupled to an input terminal of a second acquisition memory 134. An output terminal of the first acquisition memory 132 is coupled to an input terminal of a first unwrap circuit 142, and an output terminal of the second acquisition memory 134 is coupled to an input terminal of a second unwrap circuit 144. An output terminal of the first unwrap circuit 142 is coupled to an input terminal of a first waveform memory 152 and an output terminal of the second unwrap circuit 144 is coupled to an input terminal of a second waveform memory 154. An output terminal of the first waveform memory 152 is coupled to a first input terminal of a rasterizer 160 and an output terminal of the second waveform memory 154 is coupled to a second input terminal of the rasterizer 160. An output terminal of the rasterizer 160 is coupled to an input terminal of a display device 170.

An output terminal of the trigger circuit 180 is coupled to a control sequencer 190. Respective control signal output terminals of the control sequencer 190 are coupled to corresponding input terminals of the first and second A/D converters, 122 and 124, the first and second unwrap circuits, 142 and 144, and the rasterizer 160. A status output terminal of the control sequencer 190 is coupled to a corresponding input terminal of a central processing unit (CPU) 200. Respective control output terminals of the CPU 200 are coupled to corresponding input terminals of the control sequencer 190 and the trigger circuit 180.

The digital oscilloscope in FIG. 2 is illustrated as including only two input signal channels. One skilled in the art, however, will understand that more than two channels may be simultaneously processed in the same manner. More specifically, digital storage oscilloscopes including four input signal channels are widely available. In addition, in FIG. 2, the acquisition memories 132 and 134 and the waveform memories 152 and 154 are illustrated as separate memories. However, one skilled in the art will understand that these memories may be implemented by allocating separate portions of a single larger memory to these different functions.

In operation, the first and second A/D converters 122 and 124 generate respective digital sample sequences representing the channel 1 and channel 2 input signals CH1 and CH2, under the control of the control sequencer 190. These sample sequences are stored in their respective acquisition memories 132 and 134. The trigger circuit 180 generates a trigger signal when an input signal or a combination of input signals at its input terminals satisfies a user specified trigger condition. The trigger circuit 180 sends the trigger signal to the control sequencer 190, which determines which of the samples stored in the respective acquisition memories corresponds to the left edge of the desired waveform traces depending on the timing of the trigger signal. The control sequencer 190 controls the unwrap circuits 142 and 144 to extract the samples from the respective acquisition memories 132 and 134 representing one trace of all of the signals, starting with the respective samples representing the left edges of the traces, and stores those samples in the respective waveform memories 152 and 154. The rasterizer 160 retrieves the samples from the waveform memories 152 and 154 and generates a bit mapped raster image of waveforms representing all the channel input signals (i.e. the channel 1 and 2 input signals CH1 and CH2). This bit mapped raster image is then displayed on the display device 170, which may, for example, be a liquid crystal display (LCD). It will be understood that every raster signal generated by the rasterizer 160, and displayed on the display device 170, includes traces for every input channel signal, derived from the sample sequences corresponding to those signals generated by the A/D converters 122 and 124.

Referring to the trigger circuit 180, it can be seen that all of the trigger signals, i.e. the channel input signals CH1 and CH2 and all other channel input signals (not shown), are coupled to the trigger circuit 180 through the signal selector 182. It is also possible for an external signal (also not shown) to be coupled to an input terminal of the trigger circuit 180 through the signal selector 182. The signal selector 182 selects from among all the input signals those signals analyzed by the trigger circuit 180 to generate the trigger signal. The trigger circuit 180 monitors the selected signals from the signal selector 182 and when they meet a user supplied trigger condition, as supplied by the CPU 200 in response to user signals (also not shown), supplies the trigger signal to the control sequencer 190. It will be understood from FIG. 2 that the trigger condition, once set by the user, remains unchanged, and all traces produced by the rasterizer 160 are produced in response to this trigger condition being met by the input signals.

In a digital oscilloscope, the control sequencer 190 provides the location of the sample forming the left side (beginning) of the trace to the unwrap circuits 142 and 144 when the trigger criteria have been met, instead of starting a trace at that time, as in analog oscilloscopes. A digital oscilloscope, consequently, can provide much more sophisticated triggering and display modes than an analog oscilloscope can. For example, pre and post triggering and delayed triggering may all be provided by a digital oscilloscope.

However, it is sometimes desirable to use the advanced triggering and display capabilities of a digital oscilloscope to alternately display a first waveform using a first trigger condition and a second waveform using a second trigger condition. For example, some forms of synchronized stereophonic sound signals on movie film consists of two sound tracks recorded on opposite sides of the film. Under ideal circumstances, the two sound signals extracted from these sound tracks should remain in synchronism. However, due to the mechanical nature of the playback projector, these sounds tracks often lose synchronism. Regardless, it is desirable to observe these two recovered sound signals both as a stable display, i.e. each triggered by its own amplitude.

BRIEF SUMMARY OF THE INVENTION

In accordance with principles of the present invention a digital storage oscilloscope includes a source of two or more input signals and a display device. An alternate triggering mechanism includes a selector for selecting one of the input signals. A trigger circuit is responsive to the selected input signal, and generates a trigger signal when a trigger condition is satisfied. A raster signal generator includes a plurality of waveform memories each associated with a respective input signal and responsive to the trigger signal for storing data representing the selected input signal in the waveform memory associated with the selected input signal. The raster signal generator generates a raster image signal representing the selected input signal.

DETAILED DESCRIPTION OF THE INVENTION

Figure 1:
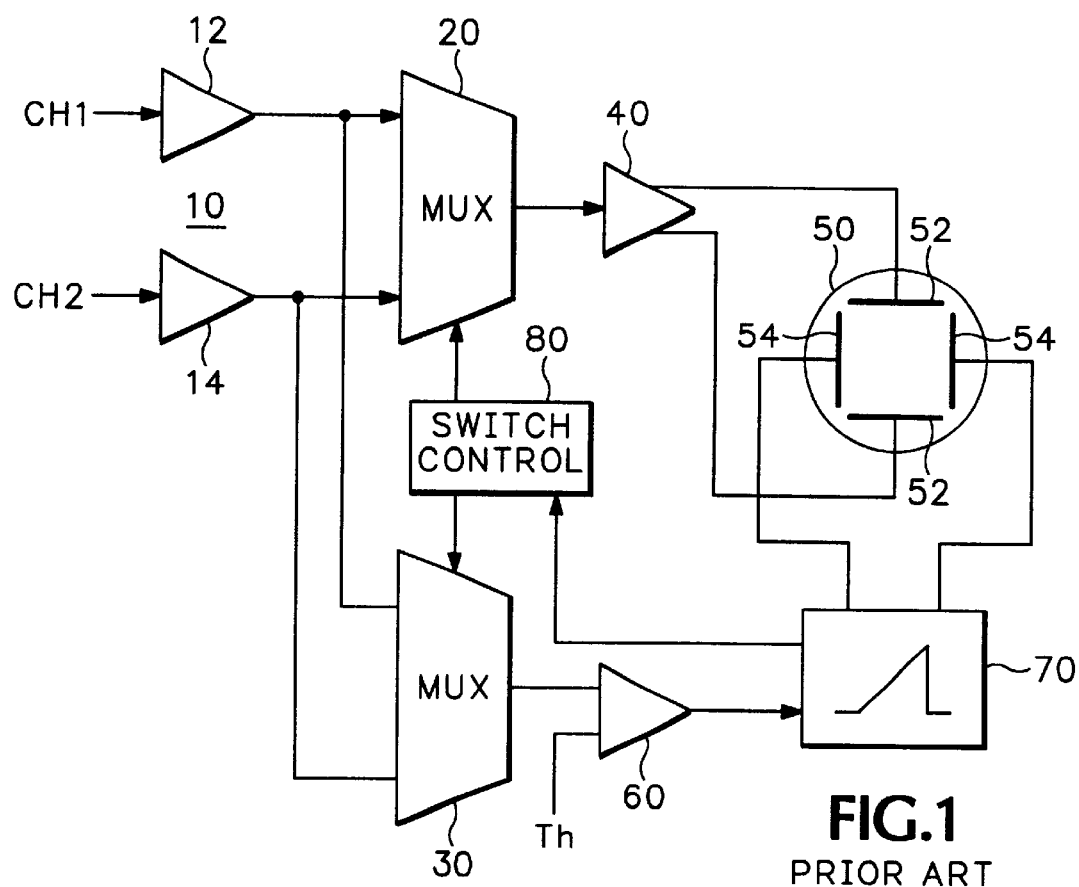
FIG. 1 is a block diagram of a prior art analog oscilloscope.
Figure 2:
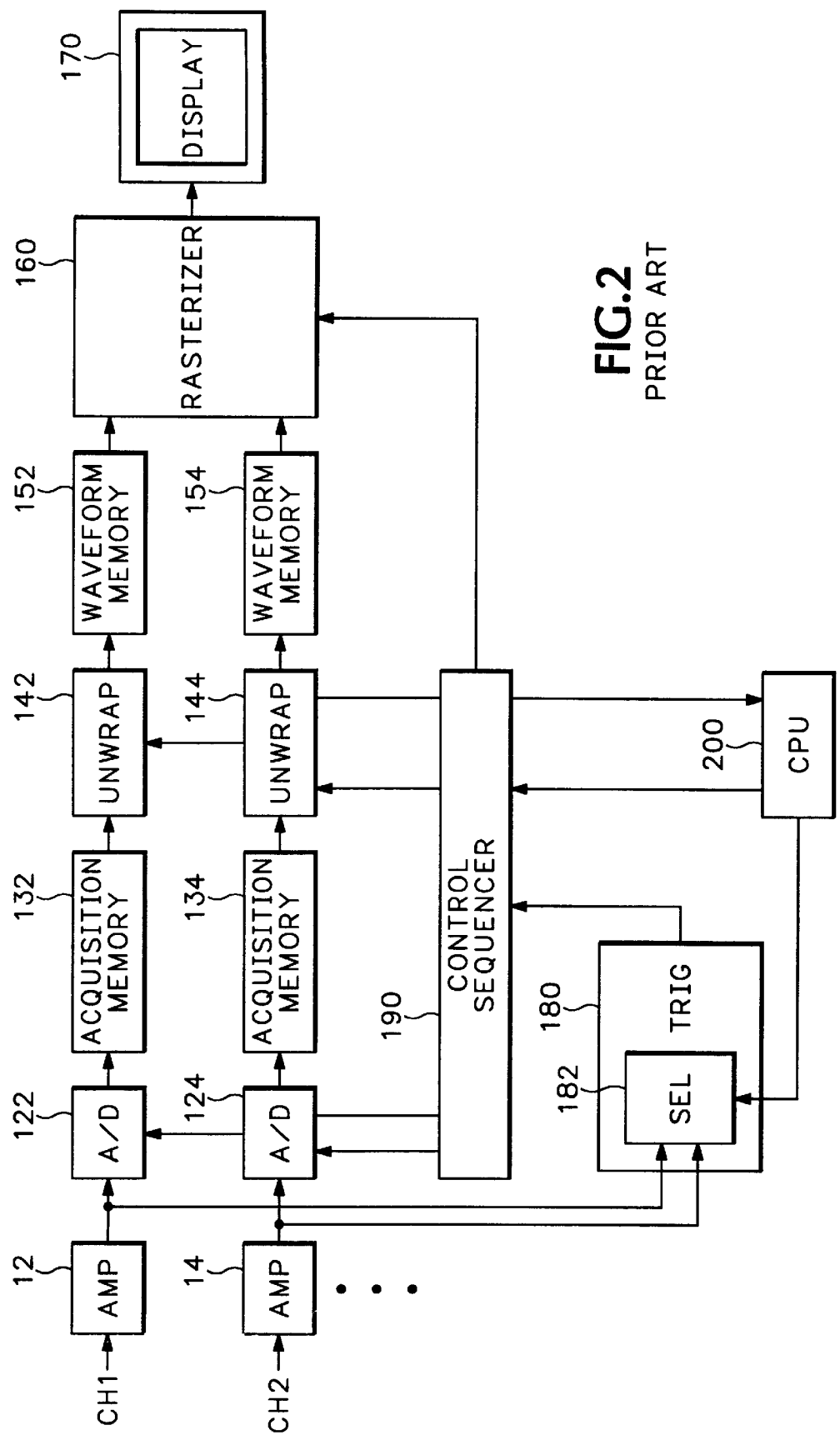
FIG. 2 is a block diagram of a prior art digital oscilloscope.
Figure 3:
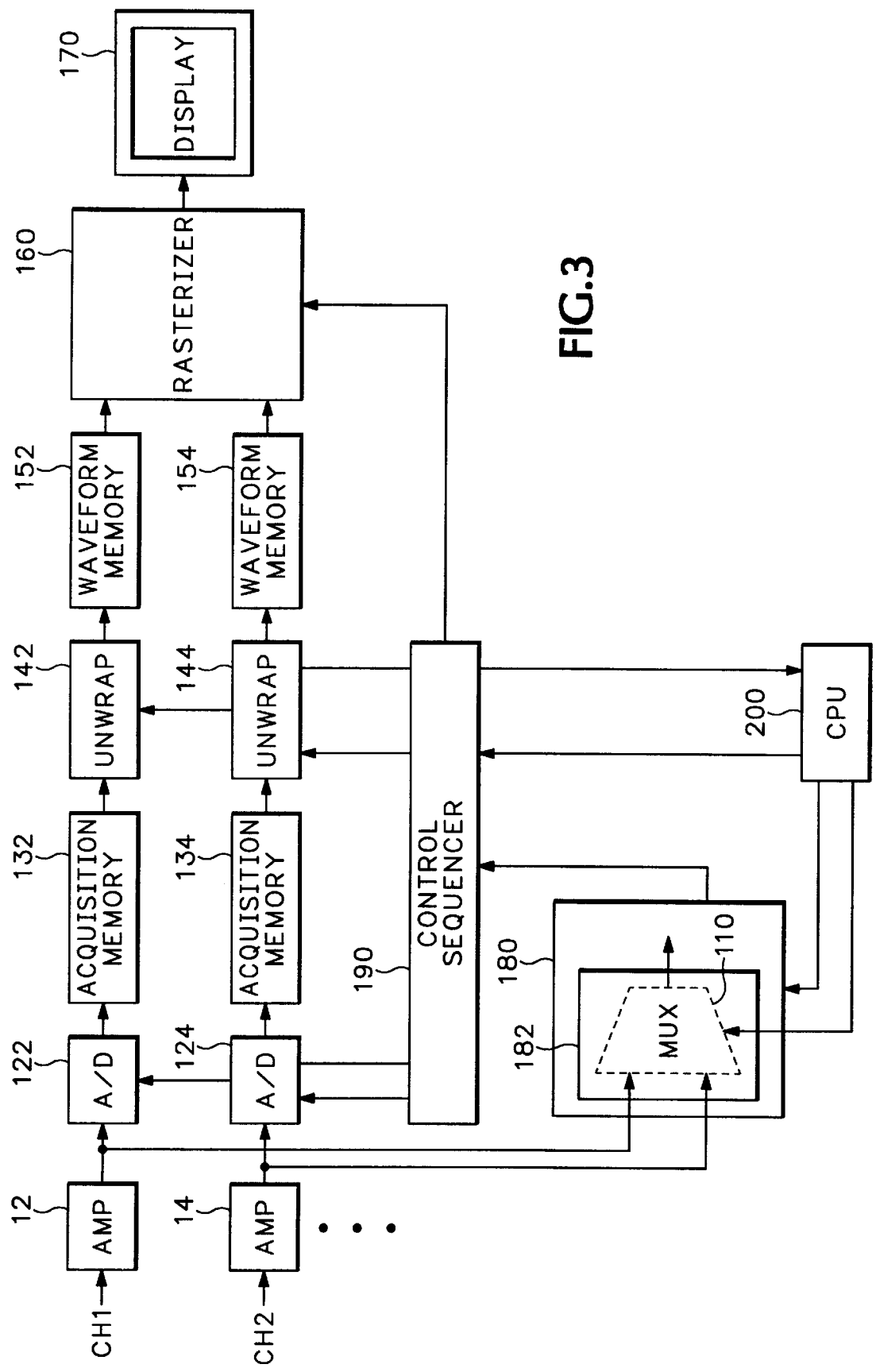
FIG. 3 is a block diagram of a digital storage oscillator according to principles of the present invention.

FIG. 3 is a block diagram of a digital storage oscilloscope according to principles of the present invention. In FIG. 3, those elements which are the same as those illustrated in FIG. 2 are designated by the same reference number and are not described in detail below.

In FIG. 3, the output terminal from the first input amplifier 12 is coupled to a first input terminal of an analog multiplexer 110 and the output terminal from the second input amplifier 14 is coupled to a second input terminal of the analog multiplexer 110. In the illustrated embodiment, the analog multiplexer 110 is implemented as a part of the signal selector 182 within the trigger circuit 180, and is illustrated in phantom. An output terminal of the analog multiplexer 110 is coupled to the remainder of the circuitry in the trigger circuit 180. The trigger circuit 180 may be any of a number of known designs. A control output terminal of the CPU 200 is coupled to the control input terminal of the analog multiplexer 110.

In the illustrated embodiment, the signal selector 182 is controlled by the CPU in such a manner as to operate in the same way as an analog multiplexer 110 would operate. Thus, in operation, the CPU 200 controls the analog multiplexer 110 to couple one of the input channel signals, CH1 or CH2, to the trigger circuit 180. For example, assume that the CPU 200 initially conditions the analog multiplexer 110 to couple the channel 1 input signal CH1 to the trigger circuit 180. In this case, the trigger signal from the trigger circuit 180 is generated based on the channel 1 input signal CH1. However, all the known sophisticated triggering and display capabilities of the digital oscilloscope may be used to generate the trigger signal, e.g. pre and post trigger and/or delayed triggering.

When a trigger signal is generated by the trigger circuit 180, the control sequencer 190 conditions the first unwrap circuit 142 to retrieve the desired samples representing the channel 1 input signal CH1 from the first acquisition memory 132 and store them in the first waveform memory 152. At the same time, the second unwrap circuit 144 is conditioned to not retrieve samples representing the second channel input signal CH2 from the second acquisition memory 134. Thus, the second waveform memory 154 is not updated with new samples representing the channel 2 input signal CH2. Instead the previous samples remain in the second waveform memory 154.

The rasterizer 160 retrieves the waveform representative samples from the waveform memories 152 and 154 and generates a raster image signal representing the waveforms corresponding to those samples. The display device 170 then displays the raster image represented by that signal. Consequently, the waveform image displayed by the display device 170 is based on the newly received samples representing the channel 1 input signal CH1 and the previously received samples representing the channel 2 input signal CH2.

When the rasterizer 160 has generated the raster image signal representing the waveforms, as described above, the CPU 200 conditions the analog multiplexer 110 to couple the channel 2 input signal CH2 to the trigger circuit 180. In this case, the trigger signal from the trigger circuit 180 is generated based on the channel 2 input signal CH2. When a trigger signal is generated by the trigger circuit 180, the control sequencer 190 conditions the second unwrap circuit 144 to retrieve the desired samples representing the channel 2 input signal CH2 from the second acquisition memory 134 and store them in the second waveform memory 154. At the same time, the first unwrap circuit 142 is conditioned to not retrieve samples representing the channel 1 input signal CH1 from the first acquisition memory 132. Thus, the first waveform memory 152 is not updated with new samples representing the channel 1 input signal CH1. The rasterizer 160 retrieves the waveform representative samples from the waveform memories 152 and 154 and generates a raster image signal representing the waveforms corresponding to those samples. The display device 170 then displays the raster image represented by that signal. Consequently, the waveform image generated by the rasterizer 160 is based on the previously received samples representing the channel 1 input signal CH1 and the newly received samples representing the channel 2 input signal CH2.

When the rasterizer 160 has generated the raster representing the waveforms as described above, the CPU 200 conditions the analog multiplexer 110 to couple the channel 1 input signal CH1 to the trigger circuit 180 again, and the process repeats. In this manner, a waveform display which operates similarly to the alternate triggering mode in analog oscilloscopes is generated. This alternate triggering mode may be used to simultaneously display two signals, each triggered by its own amplitude, so that the waveforms appear stable on the display device, even though the signals may not be in synchronism.

In one embodiment, both the first and second A/D converters 122 and 124 operate to digitize the signals at their input terminals to generate samples representing the channel 1 input signal CH1 and channel 2 input signal CH2 respectively and store them in the corresponding acquisition memories 132 and 134. In another embodiment, only the A/D converter whose channel signal is supplied to the trigger circuit 180 through the analog multiplexer 110 operates to generate samples and store them in the corresponding acquisition memory.

While the preferred embodiment has been described for a digital oscilloscope including two channel input signals, one skilled in the art will understand that any number of input signals may be included. All the input signals are coupled to corresponding input terminals of the analog multiplexer 110, and when the alternate triggering mode described above is enabled, all the input signals are sequentially coupled to the trigger circuit 180 under control of the CPU 200.

What is claimed is:

1. In a digital storage oscilloscope including a source of two or more input signals and a display device, an alternate triggering mechanism, comprising:

a selector, coupled to the input signal source, for sequentially selecting respective ones of the input signals;

a trigger circuit, responsive to the selected input signal, for generating a trigger signal when a trigger condition is satisfied; and a raster signal generator, coupled between the input signal source and the display device, and including a plurality of waveform memories each associated with a respective input signal and responsive to the trigger signal for storing data representing the selected input signal in the waveform memory associated with the selected input signal, the raster signal generator generating an image signal representing the waveform of the signals represented by the data in the plurality of waveform memories.

2. The mechanism of claim 1 wherein the selector comprises an analog multiplexer.

3. The mechanism of claim 1 wherein the raster signal generator comprises:

a plurality of digitizers, each responsive to a respective input signal for generating a sequence of samples representing the respective input signal;

a plurality of waveform sample selectors, coupled to respective digitizers and responsive to the trigger signal, for selecting samples representing a waveform of the selected input signal and storing the selected samples in the waveform memory associated with the selected input signal; and a rasterizer, coupled to the plurality of waveform sample selectors for generating the raster image signal representing at least the waveform corresponding to the selected input samples for the selected input signal.

4. The mechanism of claim 3 wherein each of the plurality of digitizers comprises:

an analog to digital converter, responsive to the respective input signal, for generating the sample sequence; and an acquisition memory, coupled to the analog to digital converter, for storing the sample sequence.

5. The mechanism of claim 4 wherein each of the waveform sample selectors comprises:

a waveform circuit, coupled to the acquisition memory and responsive to the trigger circuit, for retrieving samples representing the waveform of the respective input signal if the respective input signal is the selected input signal and storing the selected samples in the waveform memory associated with the selected input signal.

6. The mechanism of claim 5 wherein the rasterizer is coupled to the plurality of waveform memories and generates the raster image signal representing the waveforms corresponding to the stored input samples for all of the input signals.

7. The mechanism of claim 3 wherein each of the plurality of waveform sample selectors comprises:

a waveform circuit, coupled to the respective digitizer and responsive to the trigger signal, for selecting samples representing the waveform of the respective input signal if the respective input signal is the selected input signal and storing the selected samples in the waveform memory associated with the selected input signal.

8. The mechanism of claim 7 wherein the rasterizer is coupled to the plurality of waveform memories and generates the raster image signal representing the waveforms corresponding to the stored selected input samples for all of the input signals.

9. The mechanism of claim 1 further comprising a central processing unit (CPU), responsive to user inputs, and coupled to the selector and raster image signal generator, for controlling the operation of the alternate triggering mechanism.

10. In a digital storage oscilloscope including a source of at least two input signals, and a display device, a method for providing alternate triggering, comprising the steps of:

sequentially selecting respective ones of the input signals;

generating a trigger signal, in response to the selected input signal, when a trigger condition is satisfied;

storing data representing the selected signal in response to the trigger signal;

generating a raster image signal from newly stored data representing the selected input signal; and displaying an image represented by the image signal.

11. The method of claim 10 wherein the raster image signal generating step further comprises the step of generating the raster image signal from previously stored data represented non-selected input signals.

* * * * *